US008050903B1

(12) United States Patent
Bosshart et al.

(10) Patent No.: US 8,050,903 B1
(45) Date of Patent: Nov. 1, 2011

(54) APPARATUS AND METHOD FOR CHECKPOINTING SIMULATION DATA IN A SIMULATOR

(75) Inventors: Patrick W. Bosshart, Dallas, TX (US); Derek James Smith, Dallas, TX (US); Daniel Charles Pickens, Garland, TX (US); Douglas J. Matzke, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 08/112,906

(22) Filed: Aug. 26, 1993

Related U.S. Application Data

(63) Continuation of application No. 07/530,716, filed on May 29, 1990, now abandoned.

(51) Int. Cl.
*G06F 17/50* (2006.01)

(52) U.S. Cl. .............................. 703/15; 703/14; 703/13

(58) Field of Classification Search ............. 364/DIG. 1, 364/DIG. 2, 578, 488, 489, 490; 395/500, 395/800; 371/23; 703/13–17
See application file for complete search history.

(56) References Cited

U.S. PATENT DOCUMENTS

| 4,727,545 | A | * | 2/1988 | Glackemeyer et al. | 714/33 |
|---|---|---|---|---|---|
| 4,814,971 | A | * | 3/1989 | Thatte | 395/575 |
| 4,872,125 | A | * | 10/1989 | Catlin | 703/16 |
| 4,873,656 | A | * | 10/1989 | Catlin | 703/16 |
| 4,907,180 | A | * | 3/1990 | Smith | 703/14 |
| 4,916,647 | A | * | 4/1990 | Catlin | 703/16 |
| 4,924,429 | A | * | 5/1990 | Kurashita et al. | 703/15 |
| 5,146,460 | A | * | 9/1992 | Ackerman et al. | 371/23 |
| 5,247,468 | A | * | 9/1993 | Henrichs et al. | 364/578 |
| 5,251,227 | A | * | 10/1993 | Bruckert et al. | 714/23 |
| 5,325,309 | A | * | 6/1994 | Halaviati et al. | 364/488 |
| 5,327,361 | A | * | 7/1994 | Long et al. | 364/578 |
| 5,375,074 | A | * | 12/1994 | Greenberg et al. | 703/17 |
| 5,412,801 | A | * | 5/1995 | de Remer et al. | 395/575 |
| 5,455,929 | A | * | 10/1995 | Bosshart et al. | 395/500 |
| 5,604,889 | A | * | 2/1997 | Pickens et al. | 703/15 |
| 5,604,894 | A | * | 2/1997 | Pickens et al. | 703/15 |

OTHER PUBLICATIONS

Itaru Aramaki "Logic Simulator GPLS-I", International Business Machine , GDL4 (Jul. 1972) pp. 1-10.*

* cited by examiner

*Primary Examiner* — Kenneth R Coulter
(74) *Attorney, Agent, or Firm* — Wade J. Brady, III; Frederick J. Telecky, Jr.

(57) ABSTRACT

Apparatus for storing all logic simulation signal values generated by a logic simulator during a simulation run is provided. The apparatus includes a runtime array for storing a plurality of signal values for each time instance in a predetermined time period, and a checkpoint cache for selectively storing the plurality of signal values stored in the runtime array at selected time instances. A hyper-checkpoint array is further provided to checkpoint the signal values in the checkpoint cache. In addition, the time instances and values of memory writes are also checkpointed. A user may retrieve the value of any signal values generated during the simulation run and may additionally rewind the simulator to a user-specified time in the simulation run.

59 Claims, 6 Drawing Sheets

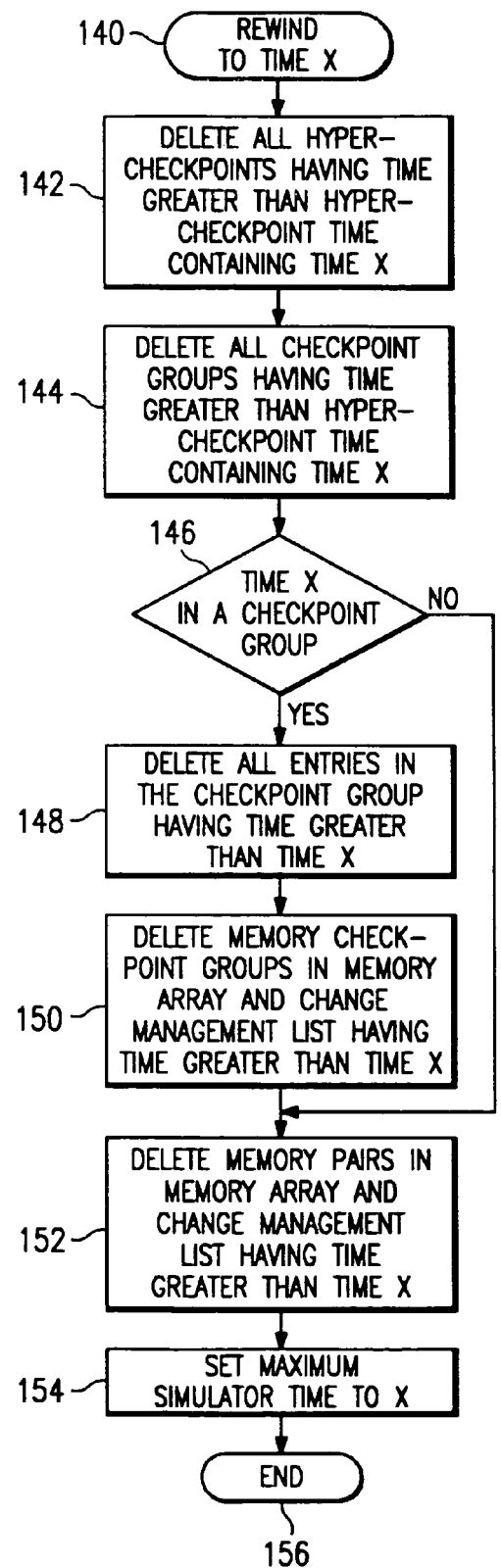

APPARATUS AND METHOD FOR CHECKPOINTING SIMULATION DATA IN A SIMULATOR

This application is a Continuation of application Ser. No. 07/530,716, filed May 29, 1990 now abandoned.

TECHNICAL FIELD OF THE INVENTION

This invention relates generally to logic simulators and more particularly to apparatus and method for storing and retrieving signal values in a logic simulator.

BACKGROUND OF THE INVENTION

Logic simulators have been used by designers to test the integrity of design without actually building the hardware. The logic simulator simulates the functions performed by the circuit and provides the designer an opportunity to examine the signals generated by the design. From these signals, the designer may uncover errors in the design.

In the event that a design error is found, the logic simulator allows the designer to modify the design and rerun the logic simulation, thereby decreasing the edit-debug cycle time and greatly reducing the overall circuit design time. Therefore, designers have come to rely on logic simulators as an essential design tool.

During the course of a logic simulation, certain signal values, such as those signals generated by the design, are stored for examination at the end of the simulation run. The availability of these signal values enable the user to determine whether errors have been uncovered by the simulation run. However, for simulations of more complex circuits that may run for hours or days, the number of signals that can be stored is greatly limited by the amount of available memory. Therefore, although the designer would like to examine most of the signal values to more accurately and expediently determine the errors, it may not be possible to specify all desirable signals. Consequently, the designer may be required to run a simulation multiple times to obtain all necessary information to diagnose the logic design error.

Once the designer has determined the problem and modified the design to eliminate the uncovered error, more simulation runs are required to ascertain the correctness of the correction and of the remainder of the design. It is likely more errors will be uncovered and corrected, and more simulations are run to further determine the accuracy of the design.

It is obvious from the foregoing that although logic simulators are invaluable design aides, they are not without problems. For example, they do not provide a designer access to all signal values for the duration of simulation time due to the large number of signals and the unavailability of memory. Certainly, to add memory capacity large enough for all the signal values would be impractical and expensive.

Additionally, logic simulators require an entire simulation to be rerun after the design has been modified to determine the correctness of the fix. To rerun an entire simulation may require days and weeks. Both aforementioned problems add considerably to the edit-debug time a designer must spend to ensure the correctness of the design.

The present invention is directed to overcoming one or more of the problems as set forth above.

SUMMARY OF THE INVENTION

In accordance with the present invention, apparatus and method for checkpointing signal and memory values in logic simulations are provided which substantially eliminate or reduce disadvantages and problems associated with prior logic simulators.

In one aspect of the present invention, apparatus for storing all simulation signal values generated by a simulator during a simulation run is provided. The apparatus includes a runtime array for storing a plurality of signal values for each time instance in a predetermined time period, and a checkpoint cache for selectively storing the plurality of signal values stored in the runtime array at selected time instances.

In another aspect of the present invention, a hyper-checkpoint array is further provided to checkpoint the signal values in the checkpoint cache. In addition, the time instances and values of memory writes are also checkpointed.

In yet another aspect of the present invention, a user may retrieve the value of any signal value generated during the simulation run and may additionally rewind the simulator to a user-specified time in the simulation run.

An important technical advantage of the present invention is to make available all signal values generated in a simulation run, regardless of the length and complexity of the simulation.

Another important technical advantage of the present invention provides for rewinding the state of the simulator to a prior state so that the starting point of a simulation run may be set arbitrarily.

BRIEF DESCRIPTION OF THE DRAWINGS

For a better understanding of the present invention, reference may be made to the accompanying drawings, in which:

FIG. 8 is a flowchart illustrating how the simulator may be rewound back to a predetermined time using the present invention.

DETAILED DESCRIPTION OF THE INVENTION

Figure 1:
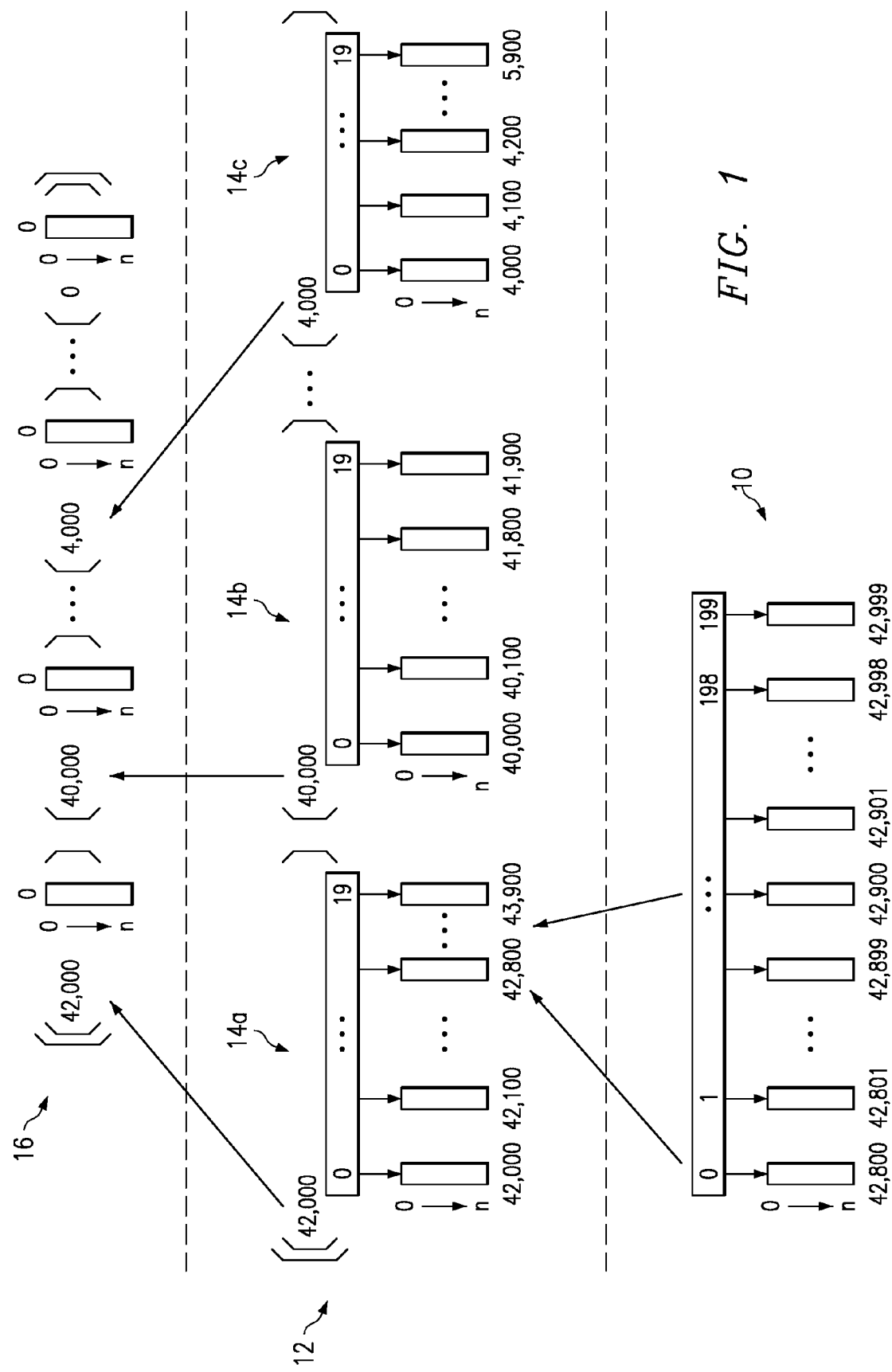
FIG. 1 is a diagram illustrating the data structures for storing the simulation register signal values.

Referring to FIG. 1, a first data structure 10, preferably implemented by an array or a list, for storing signal values during a logic simulation run is shown. In particular, a predetermined number of register signal values are stored in data structure 10, also known as the runtime array.

A user definable time parameter indicates the time interval encompassed by the runtime array 10, which acts like a circular buffer and only maintains the latest predetermined number of signal values. The exemplary runtime array 10 is shown encompassing 200 (0 to 199) clock cycles of the simulation clock, which actually represent clock cycle time 42,800 to 42,999. For each clock cycle, (n+1) signal values may be stored in runtime array 10. n may also be defined by the user.

A second data structure 12, also referred to as the checkpoint cache, is for storing or checkpointing selected signal values at a user definable checkpoint time interval. Checkpoint cache 12 may be viewed as an archive of selected signal values at predetermined clock cycles (checkpoints). The exemplary checkpoint cache 12 shown in FIG. 1 stores (n+1) signal values into a checkpoint for every 100 clock cycles, where 20 such checkpoints are grouped into a checkpoint group 14*a*-*c*. Therefore, the first checkpoint group 14*a* in checkpoint cache 12 contains clock cycle time 42,000 and the signal values for clock cycle time 42,000 through 43,900 at 100 clock cycle increments, the second checkpoint group 14*b* contains clock cycle time 40,000 and the signal values for clock cycle time 40,000 through 41,900, etc.

Checkpoint cache 12 also functions like a circular buffer where the least used or oldest signal values are purged to accommodate the latest generated signal values. For example, checkpoint cache 12 shown in FIG. 1 contains 100 clock cycle intervals, and signal values for clock cycle time prior to 4,000 are not available. Implemented in this fashion, checkpoint cache 12 will always contain the latest 20 groups of checkpointed signal values.

A third data structure 16 is used to further checkpoint the checkpointed signal values of checkpoint cache 12. Third data structure 16, also known as hyper-checkpoint array, contains the signal values at 2,000 clock cycle hyper-checkpoint intervals and includes signal values from the beginning of the simulation run. Exemplary hyper checkpoint array 16 contains a first and latest entry of clock cycle time 42,000 and its respective (n+1) signal values, and subsequent entries of signal values at every 2,000 clock cycle decrements until time zero.

From the foregoing discussion, it may be seen that the present invention has two underlying principles. First, all signal values at time X may be derived from the values of the same signals at a time Y prior to time X. Since not all signal values for all time instances are stored, the signal values for a time Y closest to time X is retrieved and the signal values at time X may be obtained by simulating from time Y to time X. Therefore, if the desired signal values at time X are not present in runtime array 10, checkpoint cache 12 and hyper-checkpoint array 16 are searched to determine Y and its respective signal values.

Second, similar to a computer cache memory, there is more likelihood that the desired signal values at time X will be one of the latest signal values currently stored in runtime array 10. Therefore, even if the simulator is required to rerun 100 cycles (if time Y is found in checkpoint cache 12) or 2,000 clock cycles (if time Y is found in hyper-checkpoint array 16), considerably little time will be spent regenerating the signal values at time X. To avoid thrashing, it is preferable that runtime array 10 encompasses at least two checkpoint time instances and that the maximum number of checkpoint groups in checkpoint cache 12 is at least 10.

Figure 2:
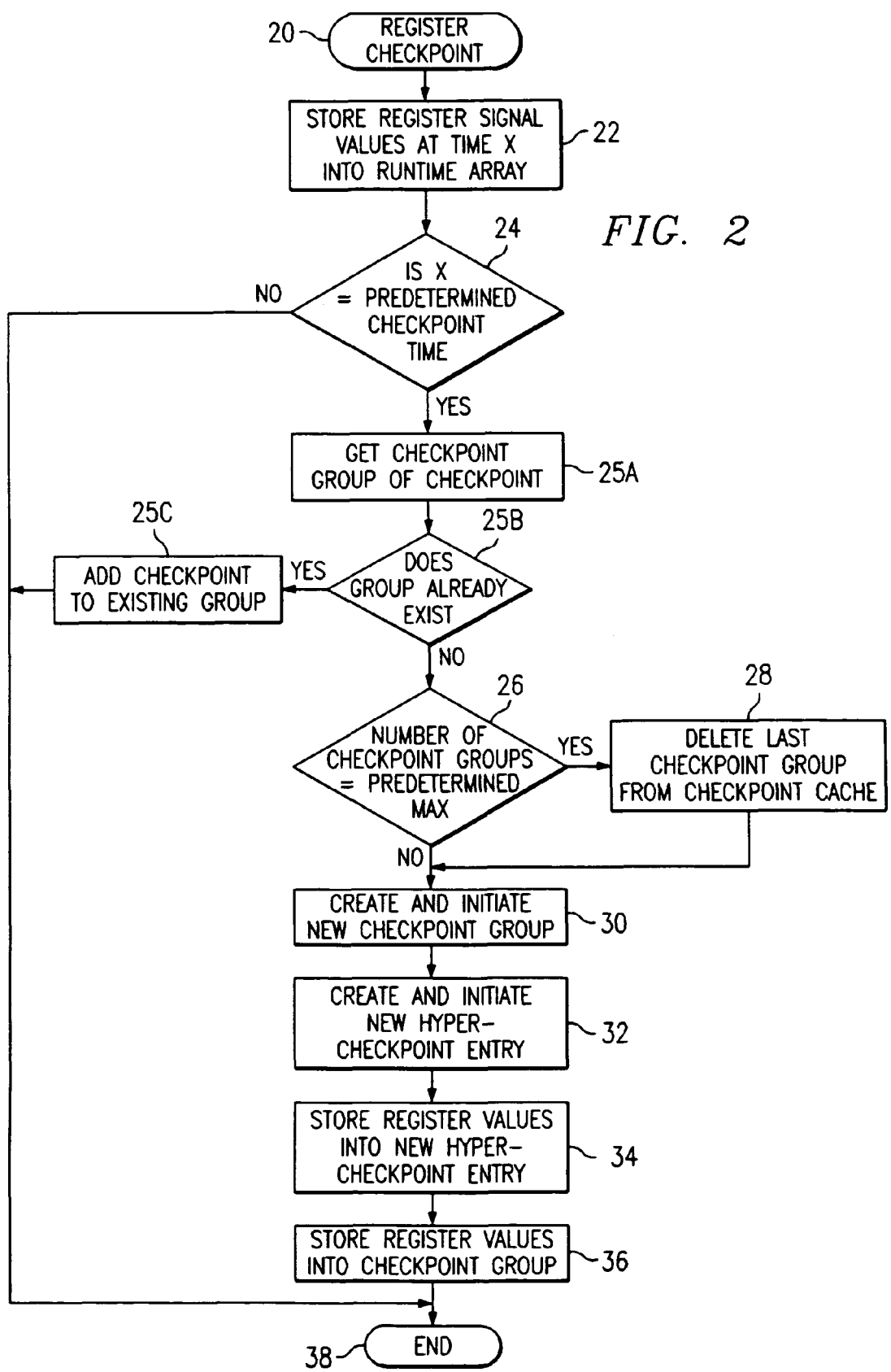
FIG. 2 is a flowchart of the register value checkpoint algorithm.

Referring to FIG. 2, the process of checkpointing the signal values are shown. In particular, flowchart 20 illustrates how register signal values are checkpointed. In block 22, the register signal values at time X are stored in runtime array 10. Time X is then checked in decision block 24 to determine whether it is one of the predetermined checkpoint times, such as clock cycle time 100, 200, 300, . . . 1000, 1100, etc. if the checkpoint time interval is defined as 100, for example. As described above, the checkpoint time interval may be set by the user or a default value may be used.

If time X is one of the predetermined checkpoint times, then determine the checkpoint group for the checkpoint, block 25A. If the checkpoint group already exists, just add the checkpoint to the group, block 25B. If the checkpoint group does not exist, execution proceeds to decision block 26 where the number of checkpoint groups currently in checkpoint cache 12 is compared with a predetermined maximum number. In the example shown in FIG. 1, the predetermined maximum number of checkpoint groups is 20. If it is determined that the number of checkpoint groups is equal to the predetermined maximum, then execution proceeds to block 28.

The procedure beginning in block 28 performs the function of purging the last checkpoint group in checkpoint cache 12 and adding the current signal values at time X to a new checkpoint group in checkpoint cache 12. In block 28 the last checkpoint group is deleted. In the preferred embodiment of the instant invention, the checkpoint groups in checkpoint cache 12 are chronologically arranged, where the most recently used checkpoint group occupies the first location in the array and the least recently used checkpoint group occupies the last location in the array. Therefore, the least used checkpoint may be readily located and deleted. Subsequently in block 30, a new checkpoint group is created. Additionally, a new entry is created for hyper-checkpoint array 16 in block 32, as the signal values for the first time instance in a checkpoint group is also hyper-checkpointed. The signal values are then stored in the newly created hyper-checkpoint entry, as shown in block 34, and are also stored in the newly created checkpoint group in checkpoint cache 12, as shown in block 36.

If, in decision block 26, it was determined that the number of checkpoint groups is not yet equal to the predetermined maximum, then the signal values are simply stored in a new checkpoint group in checkpoint cache 12, as shown in block 30 and a new hyper-checkpoint array entry is created in 32. The register value checkpoint procedure is repeatedly executed until the end of the simulation run, at which time it terminates in block 38.

Figure 3:
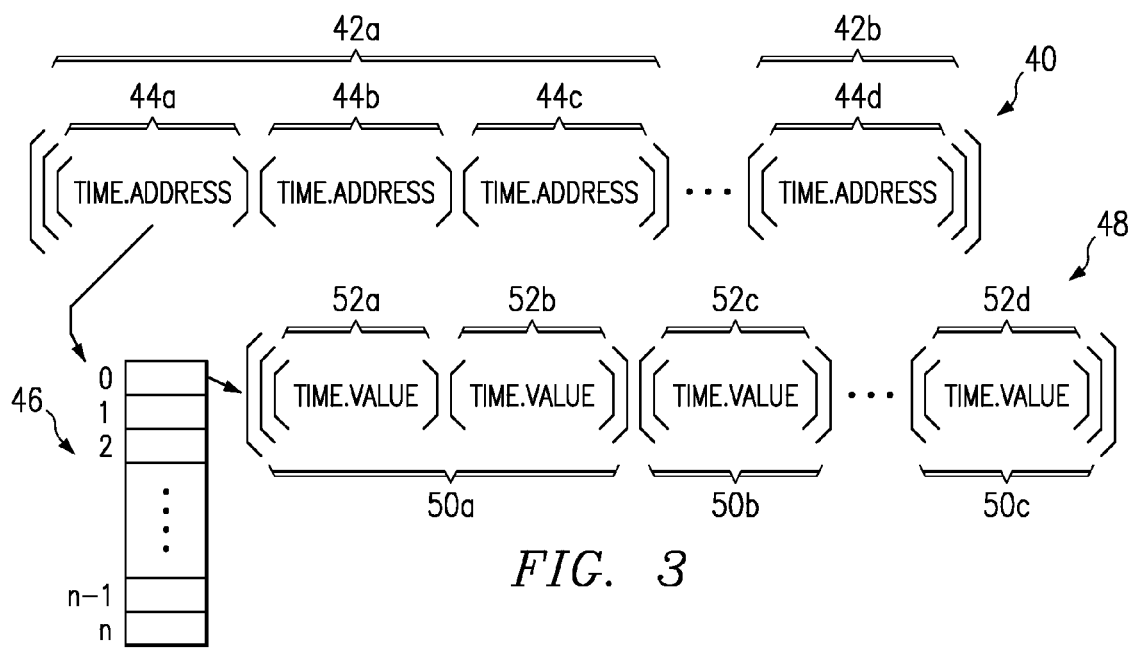
FIG. 3 is a diagram illustrating the data structures for storing the simulation memory values.

In addition to storing or checkpointing register signal values, the values written into memory during a logic simulation must also be checkpointed for later examination. Shown in FIG. 3 is a diagram illustrating the memory checkpointing portion of the present invention, which consists of a change management list 40. Change management list 40 includes a plurality of memory checkpoint groups 42*a*-*b*, each containing one or more time-address pairs 44*a*-*d*. Each memory checkpoint group 42*a*-*b* stores all writes to memory within a particular hyper-checkpoint interval. Time-address pairs 44*a*-*d* indicate the time instances at which writes were performed and their respective physical memory addresses.

Change management list 40 is also arranged chronologically with the latest checkpoint group at the beginning of the list and the oldest at the end. Similarly, time-address pairs 44*a*-*c* within checkpoint group 42*a* are also arranged so that time-address pair 44*a* having the latest time instance is positioned at the beginning of group 42*a*.

Each time-address pair 44*a*-*d* is associated with entries in a memory array 46. Memory array 46 includes a plurality of entries, where each entry represents one address location and contains a memory value list 48 of checkpoint groups 50*a*-*c*. Each checkpoint group 50*a*-*c* in memory value list 48 in turn includes one or more time-value pairs 52*a*-*d*. Time-value pairs 52*a*-*d* correspond to time-address pairs 44*a*-*d* in change management list 40. In particular, time-value pairs 52*a*-*d* include, additionally, the values stored in memory at addresses contained in corresponding time-address pairs 44*a*-*d*. Configured in this manner, memory array 46 may be indexed by a memory address to retrieve the value stored at that memory address at a particular time instance.

Change management list 40 and memory array 46 not only serve as the data structures for checkpointing memory values, but also as hyper-checkpointing data structures. Recall that in register value checkpointing described in FIGS. 1 and 2, only the latest used 20 checkpoint groups 14*a*-*c* are maintained and earlier checkpoint groups are deleted. In memory checkpointing, only the checkpoint groups that correspond to the cache checkpoint groups of the register checkpointing contain all records of memory writes during each respective checkpoint interval. The rest of the checkpoint groups are truncated to contain only the first memory write instance in each respective checkpoint interval. Implemented in this manner, the amount of memory required to store change management list 40 and memory array 46 is reduced considerably and yet still maintain enough information to regenerate the unrecorded checkpoints if necessary.

In operation, if it is desirable to retrieve or read the value stored at a memory address location Y at time X, a check is done to see if the simulator has run up to time X or if time X has been "hyper-checkpointed," i.e. the checkpoint cache group that X belongs to has been deleted to make room for other groups. If either case is true, the simulator is run forward to time X. Next, memory array 46 at address Y is scanned for the checkpoint group entry. Once the group is retrieved, the time-value pairs are searched for an entry having a time of X or immediately prior to X. Because time-value pairs 52a-b within a checkpoint group 50a are arranged from the latest to the earliest in time, the search is easily accomplished.

Figure 4:
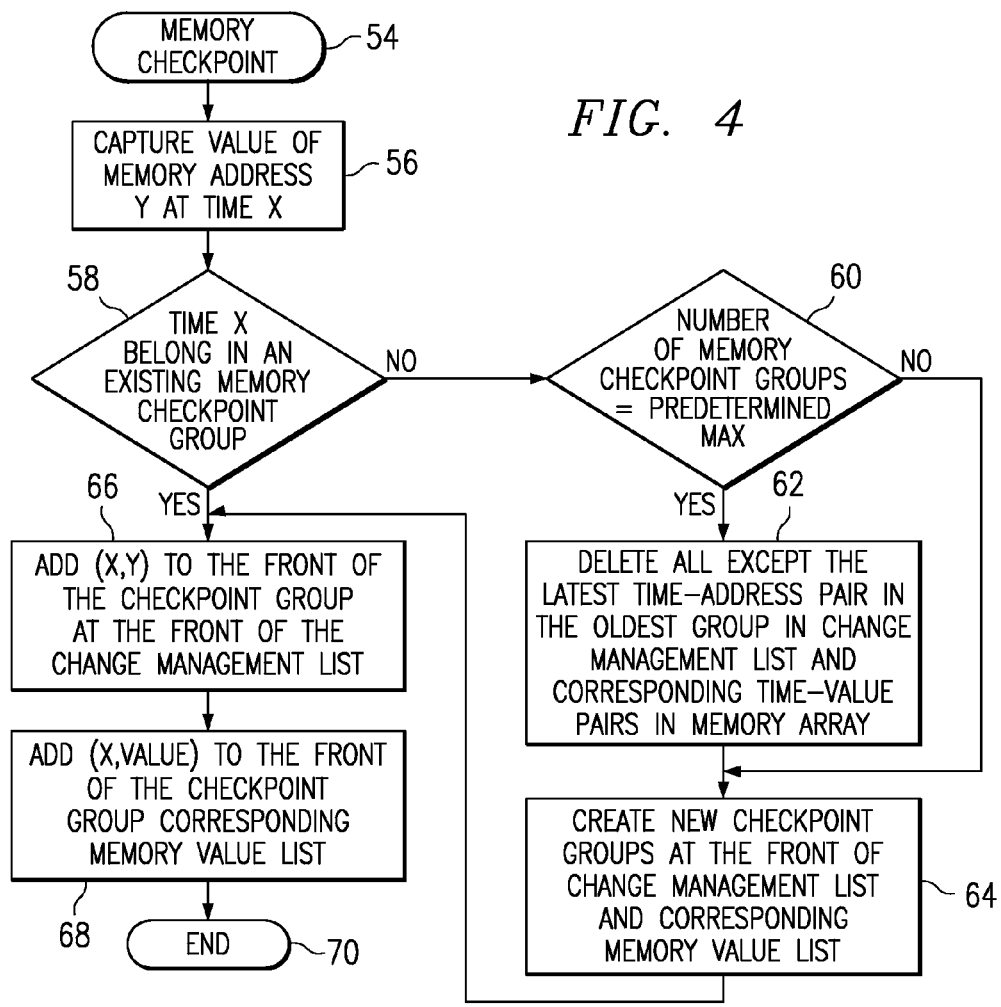
FIG. 4 is a flowchart of the memory value checkpoint algorithm.

Referring to FIG. 4, the process by which the data structures change management list 40, memory array 46 and memory value list 48 are constructed is shown. Memory checkpointing, beginning in block 54, begins by capturing the value of memory address Y at time X during simulation, as shown in block 56. In decision block 58, it is determined whether X belongs in an existing checkpoint group. This determination is made by comparing X to predetermined checkpoint time intervals. For example, if predetermined checkpoint time instances are every 2,000 clock cycles, and existing checkpoint groups start at time instances such as 0, 2000, 4000, . . . , 30000, 32000, and 34000, then if X is equal to 31023, it belongs to the checkpoint group starting at time instance 30000. On the other hand, if X is equal to 36450, then it belongs in checkpoint group for the time interval (36000-38000), which is not yet in existence. If this is the case, execution proceeds to block 60.

In block 60, the number of checkpoint groups 42a-b in change management list 40 is compared with a predetermined maximum which is the same as the number of cache groups in register checkpointing. If the number of checkpoint groups 42a-b is equal to the maximum, then all time-address pairs in the oldest used checkpoint group in change management list 40 are deleted except for the latest pair at each address. The corresponding time-value pairs in memory array 46 of deleted time-address pairs are also deleted, so that a one-to-one correspondence between change management list 40 and memory array 46 is maintained. Subsequently in block 64, new checkpoint groups are created at the front of change management list 40 and memory value lists 48. If, in decision block 60, it is determined that the number of memory checkpoint groups does not yet equal the predetermined maximum, then execution simply proceeds to block 64, where new checkpoint groups are created to accommodate the new checkpoint.

Proceeding to block 66, the memory value of memory address Y at time X captured in block 56 is added as a time-address pair (X,Y) to the first checkpoint group in change management list 40. In addition, a time-value pair (X,VALUE) is added to the front of corresponding memory value list 48 as indexed by address Y in memory array 46, as shown in block 68. The memory checkpointing algorithm is repeatedly executed until the end of simulation, at which time it terminates in block 70.

A logic simulator must serve several functions. It captures a logic design to simulate an actual working design; it captures and stores signal values generated during the simulation run; and it provides the captured signals so that a logic designer may derive therefrom whether the design functioned properly or failed in some respect. A typical design generates three types of signals: register, memory and combinational. The present invention provides the means for checkpointing the register and memory signal values, as described above, so that every signal generated during simulation is available for examination. The preferred embodiment of the present invention only checkpoint register and memory signals since combinational signal values may be easily derived from register and/or memory signal values.

Figures 5, 6:
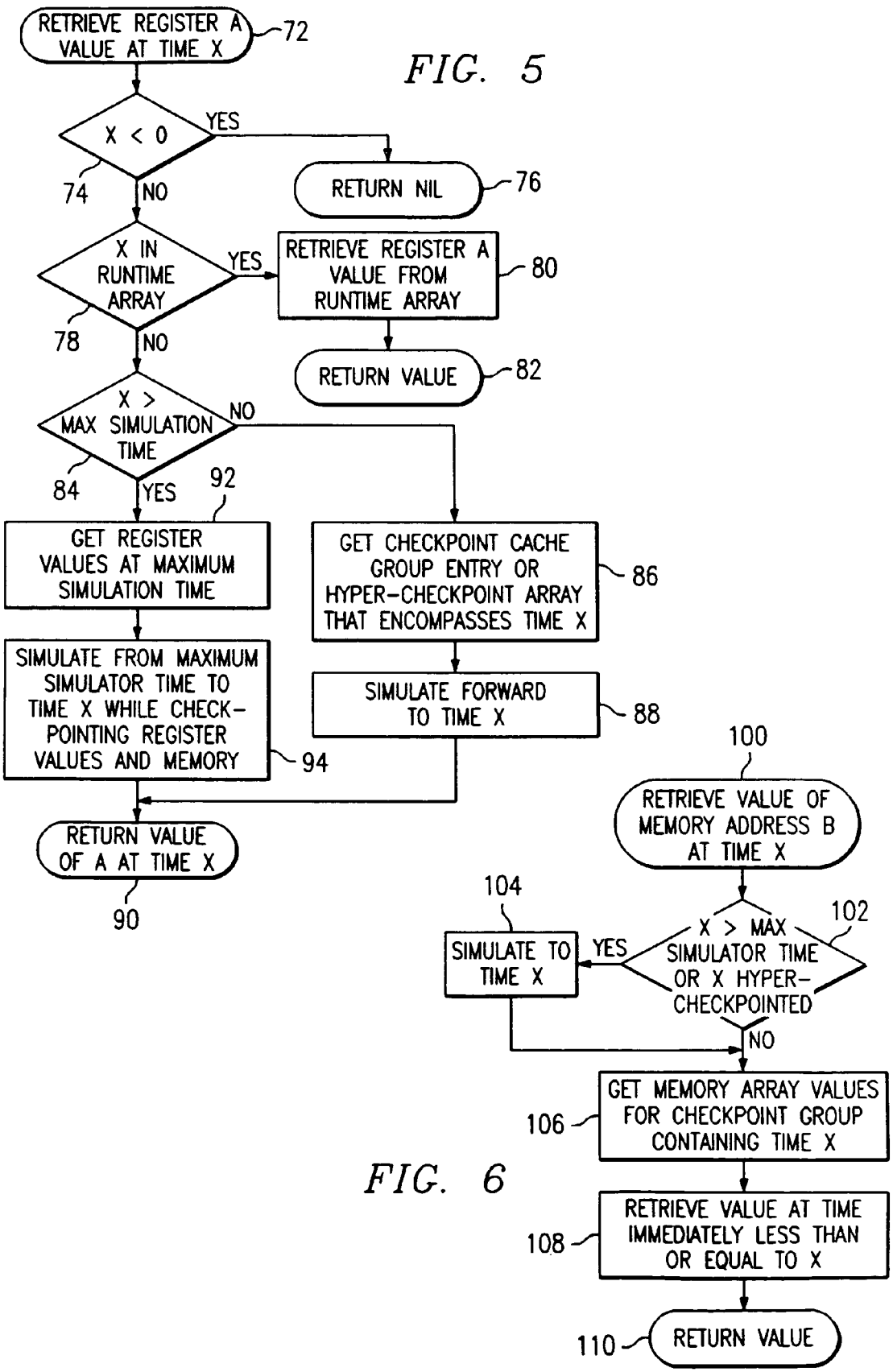
FIG. 5 is a flowchart illustrating how a checkpointed register value may be retrieved in the present invention.
FIG. 6 is a flowchart illustrating how to write to a memory location.

Referring to FIG. 5, the process 72 by which the value of a register A generated at time X may be retrieved for examination after a simulation run is shown. The particular register value and time X may be specified by a user. The method of specifying these values may encompass any implementation, such as selecting the desired register by name from a list of register names, etc. as known in the art. First it is determined whether time X is a valid value, i.e. a positive number, as shown in block 74. If X is invalid, then a nil value is simply returned and execution terminates, as shown in block 76. Otherwise, execution proceeds to block 78 where it is determined whether time X is currently encompassed in the time instances in runtime array 10. If so, then the value of register A may simply be retrieved from runtime array 10 and returned, as shown in blocks 80 and 82.

If X is not encompassed in runtime array 10, then it is determined whether time X is greater than the maximum simulation time in decision block 84. If X is not greater than the maximum simulation time, then the duration of the latest simulation run includes the specified time X, which indicates that either a checkpoint group in checkpoint cache 12 or hyper-checkpoint array may yield the desired value, as shown in block 86. Preferably, checkpoint cache 12 is searched for a checkpoint group that encompasses time X. If not found, hyper-checkpoint array 16 is searched. It is likely that neither checkpoint cache 12 nor hyper-checkpoint array 16 contains precisely time X and its register values, unless time X is one of the checkpoint time instances, in which case the value is simply retrieved and returned. Otherwise, a time instance Z that is immediately prior to time X and in either checkpoint cache 12 or hyper-checkpoint array 16 is determined. The simulator is made to simulate forward from time Z to time X, and the value of register A is retrieved and returned, as shown in blocks 88 and 90. If, on the other hand, time X is greater than the maximum simulation time, then the register signal values stored in checkpoint array 12 and the memory values stored in memory array 46 closest and prior to the maximum simulation time are used as a starting point to simulate forward to time X, which is the new maximum simulation time, as shown in blocks 92 and 94. Register and memory checkpointing as described above are performed to store the additional signal values generated during this time. When time X is reached, the value of register A is retrieved from runtime array 10 and returned, as shown in block 90.

FIG. 6 illustrates how memory values may be retrieved or read from the memory checkpointing data structures 40 and 46. A memory address B and a time instance X of interest are specified, as shown in block 100. In block 102, X is compared with the maximum simulation time and it is also determined whether the signal values at time X have been checkpointed. If X is either greater than the maximum simulation time or the signal values at time X belong in a truncated checkpoint group in change management list 40, then the memory value is probably not readily available and the maximum simulation time or the closest earlier checkpointed time is used to simulate forward to time X, as shown in block 104. The exception would be when X happens to be equal to one of the checkpointed time instances where a memory write had occurred, for which the value of memory is readily available.

Proceeding to block 106, change management list 40 is searched for a time-address pair having a time instance equal to or immediately prior to time X, and its associated time-value pair is then located in a memory value list 48 in one entry in memory array 46. The value is then readily retrievable and is returned. The above steps are shown in blocks 106 and 108.

Figure 7:
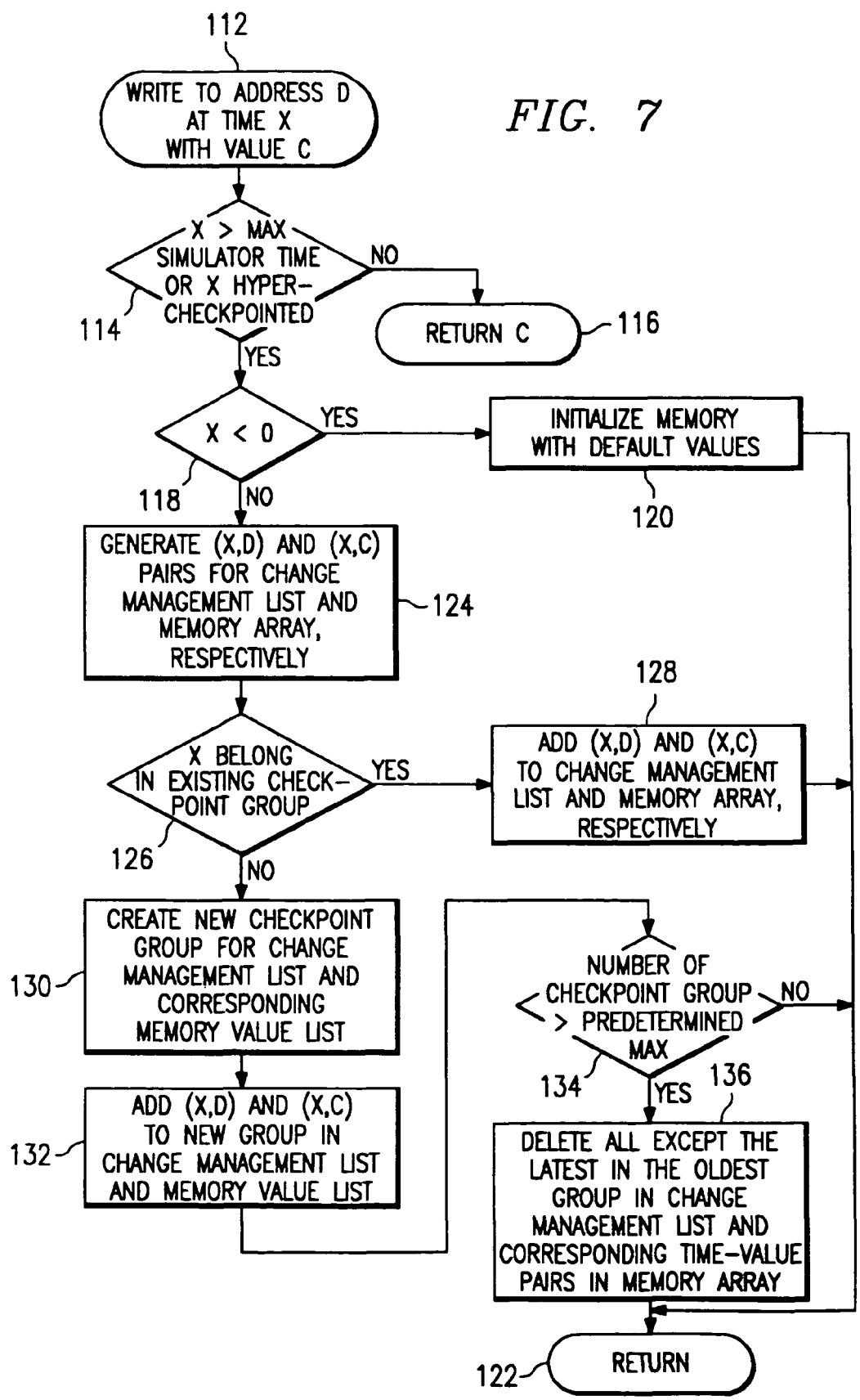
FIG. 7 is a flowchart illustrating how to read a checkpointed memory value.

The mechanism 112 for writing a value C to an address location D at time X is provided by the present invention and shown in FIG. 7. Time X is first compared with the maximum simulation time and it is further determined whether X belongs in one of the truncated checkpoint groups or hyper-checkpoint groups. If in decision block 114 it is determined that X is either greater than the maximum simulation time or X has been hyper-checkpointed, then the value C is returned, as shown in block 116. Otherwise, X is further checked to determine whether it is less than zero in block 118. If X is less than zero, then the memory is initialized to default values, as shown in block 120, and execution returns in block 122.

If X does not meet any of the conditions in decision blocks 114 and 118, then time-address (X,D) and time-value (X,C) pairs are created for change management list 40 and memory array 46, respectively. If, in block 126, it is determined that time X belongs to an existing checkpoint group in change management list 40, then the time-address and time-value pairs are added to the appropriate checkpoint group in change management list 40 and to the appropriate checkpoint group in the appropriate memory value list 48, as shown in block 128, and execution returns in block 122.

If X does not belong in an existing checkpoint group, new checkpoint groups are created for both change management list 40 and appropriate memory value list 48, as shown in block 130. The time-address and time-value pairs are then added to the newly created checkpoint groups, as shown in block 132. In block 134, the number of checkpoint groups are compared with the predetermined maximum, and if it is greater, then the oldest checkpoint group in change management list 40 is purged of all except the latest time-address pair, as shown in block 136. Additionally, the corresponding time-value pairs of the deleted time-address pairs are also purged from memory array 46. Execution subsequently terminates in block 122.

Generally, logic designers go through edit-debug cycles in which a simulation is run, errors are detected, a correction is made, and the simulation is rerun until the design is satisfactorily error-free. It is common for each simulation run to require days or weeks to complete, and it is also likely that the errors occur near the end of the simulation run. After determining the source of the error and applying a fix, an entire simulation has to be rerun to check the correctness of the fix, which may also be near the end of the run. Thus, time is wasted in rerunning the portion of the simulation which precedes the error. The present invention provides for a mechanism which restores the simulator to a prior state. In doing so, the simulator may be restored to a state just prior to the crucial point of the simulation, and simulation runs may begin therefrom. Implemented in this manner, the edit-debug cycle time is greatly reduced by eliminating the need to run the entire simulation.

Referring to FIG. 8, the simulator rewind mechanism 140 which restores the state of the simulator to a prior state as specified by time X is shown. In block 142, hyper-checkpoint array 16 is traversed and those entries having time instances greater than the hyper-checkpoint time interval encompassing time X are deleted. Checkpoint cache 12 is also searched and those checkpoint groups having time instances greater than the hyper-checkpoint time interval encompassing time X are also deleted. If X is in a particular checkpoint group in checkpoint cache 12, as determined in decision block 146, then those entries in the particular checkpoint group having time instances greater than time X are also deleted, as shown in block 148.

Additionally, change management list 40 is also traversed and those checkpoint groups having time instances greater than time X are deleted, as shown in block 150. Those time-address and time-value pairs in change management list 40 and memory value lists that have time instances greater than time X are further deleted, as shown in block 152. Implemented in this manner, the register and memory checkpoint data structures contain only those signal values generated at times prior to time X. In block 154, the maximum simulation time is set to X to reflect the purged data structures. Execution terminates in block 156.

Having rewound the state of the simulator as described above, the user may simply indicate a new maximum simulation time and simulation may run forward from time X.

Although the present invention, as presented herein, is built upon a register transfer level (RTL) simulator, the present invention may be equally applicable to other simulators, such as gate level and transistor level simulators. In particular, the present invention is applicable to those situations where a large number of values are generated and stored following some prescribed and orderly fashion. By storing or checkpointing selected signal values as described herein, the amount of memory required to accommodate the signal values is greatly decreased.

Although the present invention has been described in detail, it should be understood that various changes, substitutions and alterations may be made thereto without departing from the spirit and scope of the invention as defined by the appended claims.

What is claimed is:

1. Apparatus for storing simulation memory values generated during a simulation run, comprising:
 a change management list for storing a simulation time instance and a memory address location in response to a value being written to said memory address location; and
 a memory array for storing a simulation time instance and said value being written to said memory address location.

2. A method of logic simulation comprising:
 storing logic simulation values in a circular buffer, wherein said circular buffer contains said logic simulation values for a predetermined time interval;
 storing a first set of checkpoints of said logic simulation values in a second level of memory; and
 storing a second set of checkpoints of said first set of checkpoints in a third level of memory.

3. A method of logic simulation comprising storing logic simulation memory values and corresponding time instances in a memory, where for some checkpoint intervals all time values are kept and for other checkpoint intervals only the first memory write instance in each interval is kept, said time instances correspond to when said memory values were written in said memory.

4. A method of grouping time instances in a logic simulator with a runtime clock and logic simulation values, comprising:

setting a first predetermined time interval of one clock cycles of said runtime clock;

setting a second predetermined time interval of clock cycles of said runtime clock greater than said first time interval;

setting a third predetermined time interval of clock cycles of said runtime clock greater than said second time interval;

storing said logic simulation values in a first data memory array at said first predetermined time intervals;

storing said logic simulation values in a second data memory array at said second predetermined time intervals; and storing said logic simulation values in a third data memory array at said third predetermined time intervals.

5. The method of claim 4, wherein said second data memory array replaces a least used group of time instances with an incoming group of time instances.

6. The method of claim 4, wherein said first data memory array comprises a circular buffer.

7. Apparatus for storing a plurality of logic simulation signal values and a plurality of memory values in a logic simulator, said simulator including a runtime clock, said apparatus comprising:

a first data memory array for storing said plurality of logic simulation signal values generated at a plurality of time instances of the runtime clock where for each time instance a plurality of logic signal values are stored; and a second data memory array for storing a fixed predetermined set of said plurality of logic simulation signal values stored in said first data memory array generated at a selected fixed plurality of non-continuous predetermined time instances.

8. The apparatus, as set forth in claim 7, wherein said first data memory array resides in a circular buffer, said buffer storing cycle times of the runtime clock and corresponding logic simulation signal values for each cycle time.

9. The apparatus, as set fourth in claim 1, wherein said first data memory array comprises an array for storing said time instances and said signal values generated at each said time instance.

10. The apparatus, as set forth in claim 7, wherein said second data memory array is for storing said time instances and said plurality of logic simulation signal values generated at each said selected plurality of said predetermined time instances.

11. Apparatus for storing simulation signal values generated during a circuit simulation run, comprising:

first means for circularly buffering a first set of simulation signal values generated at each simulation time instance in a predetermined time period;

second means for selectively storing a second set of simulation signal values and respective time instances from said first set of simulation signal values generated at a first predetermined time instance; and third means for selectively storing a third set of simulation signal values and respective time instances from said second set of simulation signal values generated at a second predetermined time instance.

12. The apparatus, as set forth in claim 11, further comprising:

fourth means for storing a simulation time instance and a memory address location in response to a value being written to said memory address location; and fifth means for storing a simulation time instance and said value being written to said memory address location.

13. The apparatus, as set forth in claim 12, further comprising:

means for receiving a user-specified simulation time instance; and means for rewinding said first, second and third means to said user-specified simulation time instance.

14. The apparatus, as set forth in claim 13, wherein said rewinding means further comprises:

means for deleting time instances and respective simulation signal values generated at time instances after said user-specified simulation time instance in said first, second and third means; and means for deleting time-value and time-address pairs of time instances after said user-specified simulation time instance.

15. The apparatus, as set forth in claim 12, further comprising:

means for receiving a user-specified simulation time instance and a memory address;

means for searching said fifth means for one time instance of a time instance equal to or immediately prior to said user-specified simulation time instance; and means for retrieving said memory value.

16. The apparatus, as set forth in claim 15, further comprising:

means for simulating forward from a time instance in said third means prior to said user-specified simulation time instance to said user-specified simulation time instance; and means for generating a value written to said user-specified memory address at one simulation time instance equal to or immediately prior to said user-specified simulation time instance.

17. The apparatus, as set for the in claim 12, further comprising:

means for receiving means a user-specified time instance, value and memory address; and means for writing a time-value pair containing said user-specified time instance and value to said fifth means and a time-address pair containing said user-specified time instance and memory address to said fourth means.

18. The apparatus, as set forth in claim 11, wherein said second means stores a plurality of simulation time instances and simulation sign values chronologically.

19. The apparatus, as set forth in claim 18, wherein said second means is an array with a most recent entry of said simulation instances and simulation signal values at a first location of said array.

20. The apparatus, as set forth in claim 11, wherein said third means stores a plurality of simulation time instances and simulation signal values chronologically.

21. The apparatus, as set forth in claim 20, wherein said third means is an array with a most recent entry of said simulation time instances and simulation signal values is stored at a first location of said array.

22. The apparatus, as set forth in claim 11, wherein said first means contains the simulation time instances and simulation signal values of a most recent predetermined time period.

23. The apparatus, as set forth in claim 11, further comprising: means for receiving a user specified simulation time instance and signal name having a value; and means for retrieving the value of said signal name generated at said user-specified simulation time instance.

24. The apparatus, as set forth in claim 23, wherein said retrieving means further comprises:

means for searching for said user-specified simulation time instance in said first means and retrieving said value of said signal name in response to finding said user-specified simulation time instance;

means for searching for said user-specified simulation time instance in said second means in response to not finding it in said first means; and retrieving said value of said signal name in response to finding said user-specified simulation time instance; means for searching for a time instance immediately prior to said user-specified simulation time instance in said second means in response to not finding said user-specified simulation time instance in said second means; and means for simulating forward from said immediately prior time instance to said user-specified simulation time instance, generating a signal value at said user-specified simulation time instance and retrieving said signal value.

25. The apparatus, as set forth in claim 11, further comprising:

fourth means for storing a plurality of simulation time instances and memory address locations in response to a value being written to said memory address location;

fifth means for storing a plurality of simulation time instances and said value being written to said memory address locations; and said plurality of simulation time instances and memory address locations and said plurality of time instances and said value being separated into checkpoint groups containing all memory written during corresponding checkpoint intervals.

26. The apparatus of claim 25 wherein at least one of said checkpoint groups contains only the latest time-value pair at each memory address and its time value pair.

27. A method for storing and retrieving simulation signal values generated during a simulation run, comprising:

circularly buffering said simulation signal values generated at every simulation time instance in a predetermined time period in a first data memory array;

selectively storing in a second data memory array a simulation time instance and respective simulation signal values stored in said first data memory array in response to said simulation signal values being generated at a first predetermined simulation time instance; and further selectively storing in a third data memory array a simulation time instance and respective simulation signal values stored in said second data memory array in response to said simulation signal values being generated at a second predetermined time instance.

28. The method, as set forth in claim 27, further comprising: storing in a fourth data memory array a simulation time instance and a memory address location in response to a value being written to said memory address; and storing in a fifth data memory array a simulation time instance and said value being written to said memory address.

29. The method, as set forth in claim 28, further comprising:

receiving a user-specified simulation time instance; and rewinding said first, second and third data structures to said user-specified simulation time instance.

30. The method, as set forth in claim 29, wherein said rewinding step further comprises:

deleting simulation time instances and respective simulation signal values generated at simulation time instances after said user-specified simulation time instance in said first, second and third data memory arrays; and deleting time-value and time-address pairs of simulation time instances after said user-specified simulation time instance.

31. The method, as set forth in claim 28, further comprising:

receiving a user-specified simulation time instance and a user-specified memory address;

searching said fifth data memory array for one of a simulation time instance equal to or immediately prior to said user-specified simulation time instance; and retrieving a value written to said user-specified memory address.

32. The method, as set forth in claim 31, further comprising:

simulating forward in said third data memory array from a time instance prior to said user-specified simulation time instance to said user-specified simulation time instance; and generating said value written to said user-specified memory address at one time equal to or immediately prior to said user-specified simulation time instance.

33. The method, as set forth in claim 28, further comprising: receiving a user-specified time instance, value and memory address; and writing a time-value pair containing said user-specified time instance and said value to said fifth data memory array and a time-address pair containing said user-specified time instance and said memory address to said fourth data memory array.

34. The method, as a set forth in claim 27, wherein said selectively storing step includes the step of storing a plurality of simulation time instances and simulation signal value chronologically.

35. The method, as set forth in claim 34, wherein said selective storing step includes storing said simulation time instances and simulation signal values in said second data memory array with a first location and further storing a chronologically most recent of said simulation time instances and simulation signal values at said first location of said array.

36. The method, as set forth in claim 27, wherein said further selectively storing step includes the step of storing a plurality of simulation time instances and simulation signal values chronologically.

37. The method, as set forth in claim 36, wherein said further selectively storing step stores said simulation time instances and simulation signal values in said second and third data memory array with a first location and further storing a chronologically most recent of said simulation time instances and simulation signal values at said first location of said array.

38. The method, as set forth in claim 27, wherein said circularly buffering step includes the step of storing the simulation time instances and simulation signal values of a most recent predetermined time period.

39. The method, as set forth in claim 27, further comprising: receiving a user-specified simulation time instance and a respective simulation signal name; and retrieving a respective simulation signal value of said respective simulation signal name generated at said user-specified simulation time instance.

40. The method, as set forth in claim 39, wherein said retrieving step further comprises:

searching for said user-specified simulation time instance in said first data memory array and retrieving said respective simulation signal value in response to finding said user-specified simulation time instance therein;

searching for said user-specified simulation time instance in said second data memory array in response to not finding it in said first data memory array, and retrieving said respective simulation signal value in response to finding said user-specified simulation time instance therein;

searching for a time instance immediately prior to said user-specified simulation time instance in said second data memory array in response to not finding it in said second data memory array; and simulating forward from said immediately prior time instance to said user-specified simulation time instance, generating a simulation signal value at said user-specified simulation time instance and retrieving said simulation signal value.

41. A method for storing simulation signal values generated by a simulator during a simulation run, said simulator including a runtime clock, said method comprising:

selecting a runtime interval;

storing said simulation signal values generated at each time instance of said runtime clock during said runtime interval in a runtime array; and selectively storing said simulation signal values stored in said runtime array at a first selection of time instances separated by a predetermined interval in a checkpoint array, wherein said checkpoint array has a first location.

42. The method, as set forth in claim 41, further comprising storing a most recent time instance and its respective simulation signal values in said first location of said checkpoint array.

43. The method, as set forth in claim 41, further comprising selectively storing said simulation signal values stored in said checkpoint array at a second selection of time instances in a hyper-checkpoint array, wherein said hyper-checkpoint array has a first location.

44. The method, as set forth in claim 43, wherein said storing in said hyper-checkpoint array further includes storing said simulation signal values at said second selection of time instances separated by a second predetermined time interval.

45. The method, as set forth in claim 43, further comprising storing most recent time instances and their respective simulation signal values in said first location of said hyper-checkpoint array.

46. The method, as set forth in claim 41, wherein said storing step includes storing register signal values.

47. The method, as set forth in claim 41, wherein said storing step includes storing simulation signal values of combinational sub-circuits.

48. The method, as set forth in claim 41, further comprising: storing a time instance and a memory address location in a change management list in response to a first memory value being written to said address at said time instance; and storing a time instance and said first memory value being written to said address in a memory value array, wherein said memory value array has a first location.

49. The method, as set forth in claim 48, wherein said memory value storing step further stores a most recent time instance and its respective memory value for each memory location in said first location of said memory value array.

50. The method, as set forth in claim 48, further comprising storing a second time instance and a second memory address location for said second time instance in response to a second memory value being written to said second memory address at said second time instance.

51. The method, as set forth in claim 48, further comprising:

receiving a user-specified simulation time instance; and rewinding said runtime array, said checkpoint array, a hyper-checkpoint array, said change management list and said first memory value array to said user-specified simulation time instance.

52. The method, as set forth in claim 51, wherein said rewinding step further comprises:

deleting time instances and respective simulation signal values generated at time instances after said user-specified simulation time instance in said runtime array, said checkpoint array and said hyper-checkpoint array; and deleting time-value and time-address pairs of time instances after said user-specified simulation time instance.

53. The method, as set forth in claim 48, further comprising:

receiving a user-specified simulation time instance and a memory address;

searching said memory value array for one of a time instance equal to or immediately prior to said user-specified simulation time instance; and retrieving said memory value.

54. The method, as set forth in claim 53, further comprising:

simulating forward from a time instance prior to said user-specified simulation time instance to said user-specified simulation time instance; and disclosing a value at said memory address at said user-specified simulation time instance.

55. The method, as set forth in claim 41, further comprising: selecting a time instance to provide a selected time instance; and disclosing said simulation signal values at said selected time instance.

56. The method, as set forth in claim 55, wherein said disclosing step further comprises:

searching said runtime array for said selected time instance;

finding said selected time instance in said runtime array;

disclosing said simulation signal values stored in said runtime array which correspond to said selected time instance.

57. The method, as set forth in claim 55, wherein said disclosing step further comprises:

searching said runtime array for said selected time instance;

searching said checkpoint array for said selected time instance in response to not finding said selected time instance in said runtime array;

searching said checkpoint array for a predetermined time instance stored therein which is immediately prior to said selected time instance in response to not finding said selected time instance in said checkpoint array;

re-running said simulation run for a predetermined time period beginning at said predetermined time instance in response to finding said predetermined time instance in said checkpoint array;

storing said simulation signal values for each clock cycle of said runtime clock during said predetermined time period in said runtime array; and disclosing said simulation signal values stored in said runtime array which correspond to said selected time instance.

58. The method, as set forth in claim 55, wherein said disclosing step further comprises:

searching said runtime array for said selected time instance;

searching said checkpoint array for a said selected time instance in response to not finding said selected time instance in said runtime array;

searching said checkpoint array for a predetermined time instance stored therein which is immediately prior to said selected time instance in response to not finding said selected time instance in said checkpoint array;

searching a hyper-checkpoint array for a said selected time instance in response to not finding said predetermined time instance in said checkpoint array;

searching said hyper-checkpointing array for a predetermined second time instance stored therein which is immediately prior to said selected time instance in response to not finding said predetermined time instance in said checkpoint array;

re-running said simulation run for a predetermined time period beginning at said predetermined second time instance in response to finding said predetermined second time instance in said hyper-checkpoint array;

storing said simulation signal values for each clock cycle of said runtime clock during said predetermined time period in said runtime array;

selectively storing said simulation signal values for said first selection of time instances in said checkpoint array and disclosing said simulation signal values stored in said runtime array which correspond to said selected time instance.

59. The method, as set forth in claim 41, further comprising:

storing a time instance and a memory address location in a change management list in response to a first memory value being written to said address at said time instance;

storing a time instance and said first memory value being written to said address in a memory value array, and deleting some entries in the change management list and corresponding time values in said memory value array.

* * * * *